(12) United States Patent
Franke et al.

(10) Patent No.: US 6,756,877 B2
(45) Date of Patent: Jun. 29, 2004

(54) SHUNT RESISTOR CONFIGURATION

(75) Inventors: Torsten Franke, München (DE); Roman Tschirbs, Soest (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/237,540

(22) Filed: Sep. 9, 2002

(65) Prior Publication Data

US 2003/0075732 A1 Apr. 24, 2003

(30) Foreign Application Priority Data

Sep. 7, 2001 (DE) .......................................... 101 43 932

(51) Int. Cl.[7] .............................................. H01C 7/00
(52) U.S. Cl. ...................................................... 338/49
(58) Field of Search ..................... 338/48, 49; 361/601, 361/622, 627, 659, 660

(56) References Cited

FOREIGN PATENT DOCUMENTS

| DE | 41 15 328 A1 | 11/1991 |
|----|--------------|---------|
| EP | 1 009 030 A2 | 6/2000 |
| JP | 07 307 202 A | 11/1995 |
| JP | 11 097 203 A | 4/1999 |

*Primary Examiner*—Evan Pert
(74) *Attorney, Agent, or Firm*—Laurence A. Greenberg; Werner H. Stemer; Ralph E. Locher

(57) ABSTRACT

The present invention relates to a configuration having a first shunt resistor and at least one second shunt resistor connected in parallel with the first shunt resistor. The load terminals of the shunt resistors are disposed at the front side of the shunt resistors and between a first and a second supply potential. The load terminals each have a large-area rear-side contact connection to which different potentials are applied.

7 Claims, 4 Drawing Sheets

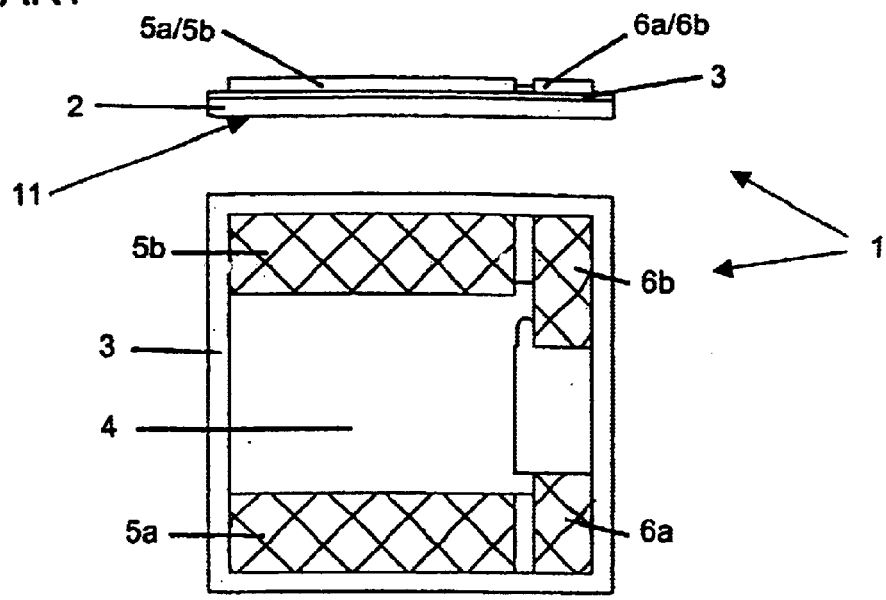
FIG. 1A
PRIOR ART
FIG. 1B
PRIOR ART
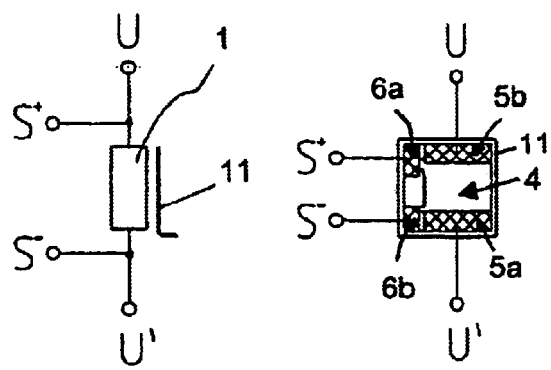
FIG. 2A
PRIOR ART
FIG. 2B
PRIOR ART

SHUNT RESISTOR CONFIGURATION

BACKGROUND OF THE INVENTION

FIELD OF THE INVENTION

The present invention relates to a shunt resistor configuration.

Shunt resistors are used to measure high currents (i.e., from a few amperes up to a few hundred amperes). Shunt resistors (hereinafter, "shunts") are measuring resistors which are connected in series with the component to be measured. The current in the main current path can be derived from the voltage dropped across the shunt resistor. Shunt resistors are employed in DC systems, since it is not possible to use entirely inductive current transformers therein. In addition, the current detection is extremely reliable with regard to precision and susceptibility to interference.

At the present time, shunt resistors are constructed on separate, insulated bases. The connecting lines for the load current and the shunt voltage measurement are connected individually. In this case, the shunt resistor is generally disposed in direct proximity to the fuses of the DC system. The fuses are configured as low-voltage high-rupturing-capacity (LVHRC) fuse elements. Accordingly, the space requirement for two individual LVHRC fuse elements, for the separately constructed shunt resistor, and also for the associated outlay on material and installation is comparatively significant.

SUMMARY OF THE INVENTION

It is accordingly an object of the invention to provide a shunt resistor configuration that overcomes the hereinafore-mentioned disadvantages of the heretofore-known devices of this general type and that has a higher degree of freedom in the layout configuration compared with conventional configurations and a smaller space requirement on the printed circuit board. In particular, the object is to realize the shunt resistor configuration with a comparatively low outlay and cost.

With the foregoing and other objects in view, there is provided, in accordance with the invention, a configuration having a first shunt resistor and at least one further shunt resistor connected in parallel with the first shunt resistor, whose load terminals disposed at the front side of the shunt resistors are disposed between a first and a second supply potential, and which each have a large-area rear-side contact connection to which different potentials are applied.

In accordance with another feature of the invention, the space-saving configuration is achieved by having the rear-side contact connections asymmetrically contact-connected to the load current terminals in such a way that the first shunt resistor is connected by its rear-side contact connection to a first conductor track, to which a first supply potential is applied, while the rear-side contact connection of at least one further shunt resistor is connected to another conductor track, to which a further supply potential is applied.

In other words, according to the invention, the rear-side contact connections of at least two shunt resistors are at different potentials of the load current path. The electrical connection to the conductor tracks is effected by bonding connections.

As a result of the asymmetrical configuration of the shunts, it is also advantageously possible for the contact area used as mounting area below the shunt to be utilized as a conductor track in the second plane.

In accordance with a further feature of the invention, a front side terminal and the rear-side contact connection of the shunt resistor are connected by through-plating.

In accordance with an added feature of the invention, the load terminal at the front side of a shunt resistor and the rear-side contact connection thereof may be electrically connected to one another by bonding wires.

In accordance with an additional feature of the invention, there is provided at least one semiconductor component connected in either parallel or series manner with the parallel circuit of the shunt resistors. The semiconductor component is electrically connected to at least one of the supply potentials.

The shunt resistor configuration is advantageously disposed in a component module. In accordance with yet another feature of the invention, the component module typically has further semiconductor components (for example diodes, MOSFETs, IGBTs, thyristors and GTOs) connected in parallel with the parallel circuit of the shunt resistors.

In accordance with yet a further feature of the invention, the shunt resistors are disposed in the load current path and have, in particular, a carrier material with good thermal conduction for the rear-side contact connection. A thin insulation layer is applied to the carrier material and at least one resistance layer is applied thereto. Sense bonding contact areas, at which the measurement voltage drop across the shunt resistor can be tapped off. Load current contact areas are provided on the front side of the shunt resistor, at which bonding connections produce the contact-making connection to conductor tracks of the load current path and to the supply voltage.

The carrier material, which (as a heat sink) serves for dissipating heat from the shunt elements and the semiconductor components, may be composed of copper. The insulation layer determines the dielectric strength of the shunt elements and has, for example, a ceramic that is electrically insulating, but has good thermal conductivity, or a ceramic containing a suitable plastic (e.g. epoxy resin) with these properties. The resistance layer applied is generally an alloy such as a Cu—Ni alloy, an Al—Cr alloy and a Cu—Mn alloy.

Other features which are considered as characteristic for the invention are set forth in the appended claims.

Although the invention is illustrated and described herein as embodied in a shunt resistor configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a diagrammatic cross-sectional view showing the construction of a known shunt resistor;

FIG. 1B is a plan view showing the construction of a known shunt resistor;

FIG. 2A is a circuit diagram of an interconnection of a known shunt resistor;

FIG. 2B is a plan view of an interconnection of a known shunt resistor;

DESCRIPTION OF THE PREFERRED EMBODIMENTS

Figures 3A, 3B:
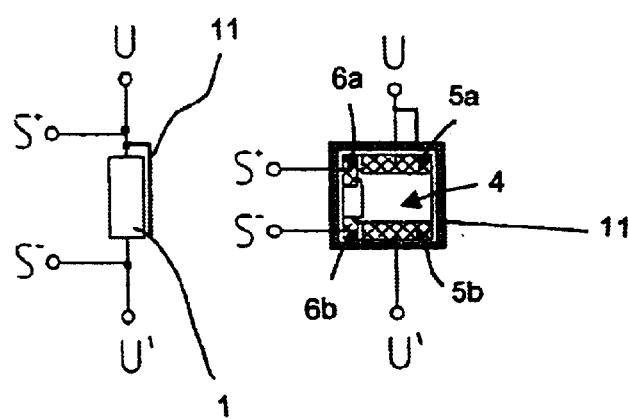
FIG. 3A is a circuit diagram of a further interconnection of a known shunt resistor.
FIG. 3B is a plan view of a further interconnection of a known shunt resistor.

In the figures of the drawing, unless specified otherwise, identical or functionally identical elements and parts are designated by identical reference symbols.

Generally, a plurality of individual components are connected in parallel in order to increase the current loading of shunt resistors. A typical construction of a known high-performance shunt is illustrated in FIGS. 1A–1B. High-performance shunts 1 generally have a carrier material 2 with good thermal conduction. A generally thin, electrically insulating, but thermally conducting insulation layer 3 is applied on the carrier 2. An actual resistance layer or a resistance pattern 4 is applied on the insulation layer 3. Load current contact areas 5a, 5b are connected to a respective supply potential U, U'. Sense contact areas 6a, 6b are provided to measure a measurement voltage. The sense contact areas 6a, 6b are contact-connected to measurement terminals $S^+$, $S^-$.

FIGS. 2A–2B show (schematically, in FIG. 2A; and in plan view in FIG. 2B) a typical contact connection of a known high-performance shunt 1 of FIGS. 1A–1B. In this case, $S^+$ and $S^-$ again designate the measurement terminals connected to the sense contact areas 6a, 6b. The load current terminals with the supply potentials U, U' are connected to the load current contact areas 5a, 5b. Reference symbol 11 designates a rear side or a rear-side contact of the shunt resistor 1. The resistance layer 4 of the shunt resistor 1 is disposed in a load current path, and is contact-connected completely to the front side of said shunt resistor. In FIGS. 2A–2B, the rear side 11 is not electrically connected to the front side and acts virtually as a shield. In the case of a high-performance shunt 1 of FIGS. 2A–2B, the insulation capability between the rear side 11 and the front side is determined by the insulation layer 3 and limits the rated voltage of such components generally to 100 volts.

Therefore, using high-performance shunt resistors in power semiconductor modules above a rated voltage of 100 volts presupposes a contact connection of the rear side 11 to one of the two load current contact areas 5a, 5b on the front side, as is illustrated in FIGS. 3A–3B. FIGS. 3A–3B show (in the circuit diagram in FIG. 3A, and in the plan view in FIG. 3B), a connection of the shunt resistor 1 configured for higher voltages. The rear side (black dotted zone) is connected to the load current terminal having the potential U.

In the case of a shunt resistor configuration having a plurality of shunt resistors 1a, 1b in the same current path, the shunt resistors are, on the one hand connected in parallel, and on the other hand introduced symmetrically into the load current path. In other words, rear-side contact connections are symmetrically located at the same supply potential, for example U', as shown in FIGS. 4A–4B.

Figure 4A:
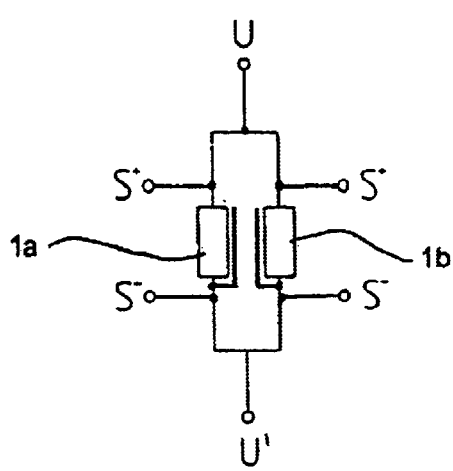
FIG. 4A is a circuit diagram of a known, parallel interconnection of two shunt resistors with symmetrically contact-connected rear sides.
Figure 4B:
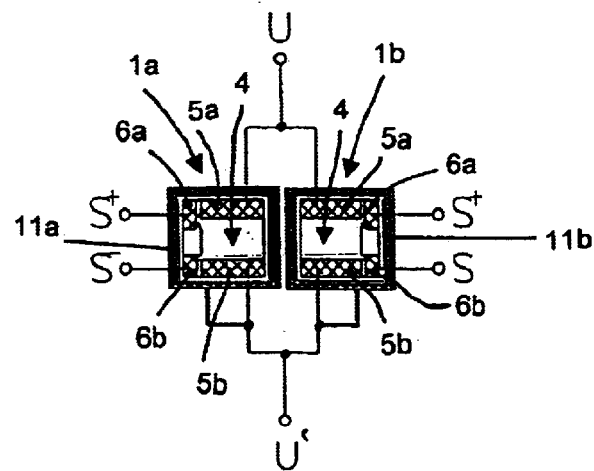
FIG. 4B is a plan view of a known, parallel interconnection of two shunt resistors with symmetrically contact-connected rear sides.
Figure 5:
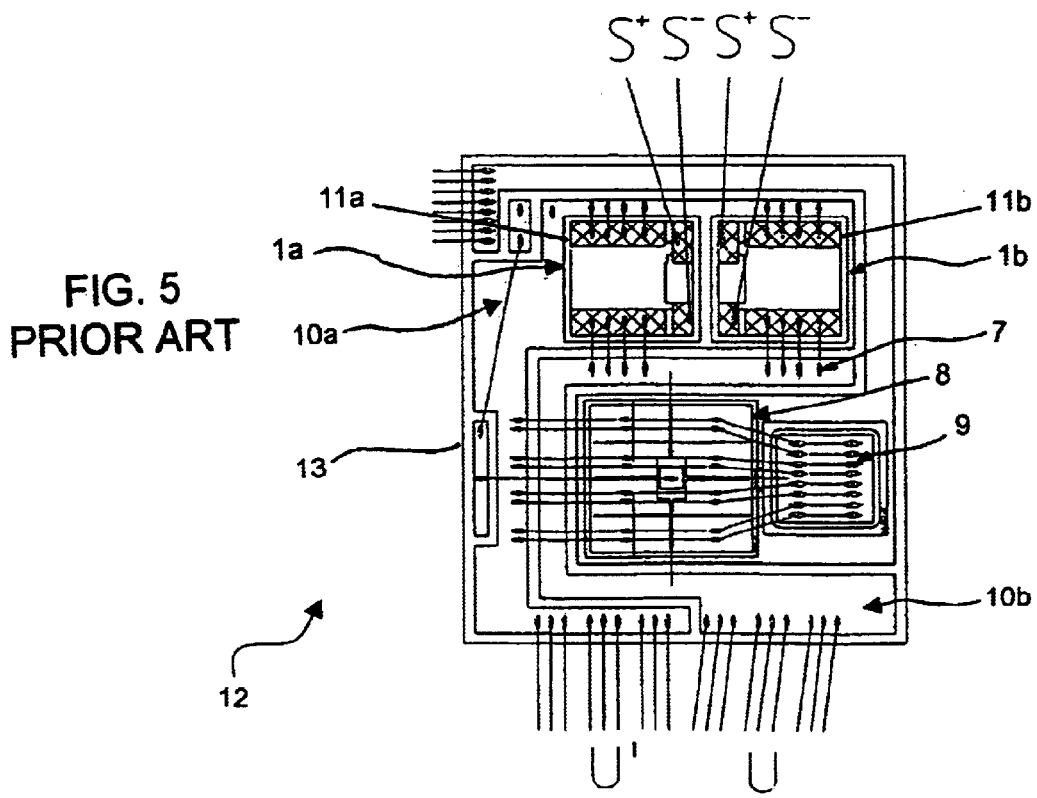
FIG. 5 is a plan view of a known shunt resistor configuration, disposed in a semiconductor module, with two symmetrical shunt resistors connected in parallel.

FIG. 5 shows a known shunt resistor configuration, disposed in a semiconductor module 12, in accordance with FIGS. 4A–4B. FIG. 5 illustrates the area conditions on a printed circuit board 13. In the configuration, two components 8, 9 are disposed on the printed circuit board 13, such as, for instance, a ceramic substrate having copper tracks (e.g., DCB). Rear-side contacts 11a, 11b of two shunt resistors 1a, 1b connected in parallel bear on the conductor track 10a.

Consequently, both the rear-side contacts 11a, 11b of the shunt resistors 1a, 1b connected in parallel are at the same potential U'. In the context of single-layer printed circuits, the respective other conductor track 10b is led laterally to the shunt resistors 1a, 1b. The shunt resistors 1a, 1b are respectively contact-connected to the conductor tracks 10a, 10b connected to the load current terminals via bonding connections 7.

Accordingly, in known shunt resistor configurations connected in parallel, the rear-side contacts 11a, 11b are in each case disposed on the same conductor track. Thus, the rear-side contacts 11a, 11b typically have to be disposed close together due to the layout of the respective printed circuit board 13. As a result, although the current-carrying capacity can be increased in a satisfactory manner, the contact connection of the shunt resistors 1a, 1b connected in parallel requires additional space on the printed circuit board 13 for the routing of the conductor tracks 10a, 10b and configuration of the bonding contact connections. Consequently, this gives rise to considerable restrictions in the layout configuration, particularly in the case of high-performance shunts having relatively large-area conductor tracks 10a, 10b printed in single-layer fashion. This often results in a larger area requirement on the printed circuit board 13, particularly in the case of too many components 8, 9 or shunt resistors 1a, 1b in a semiconductor module 12.

Figure 6A:
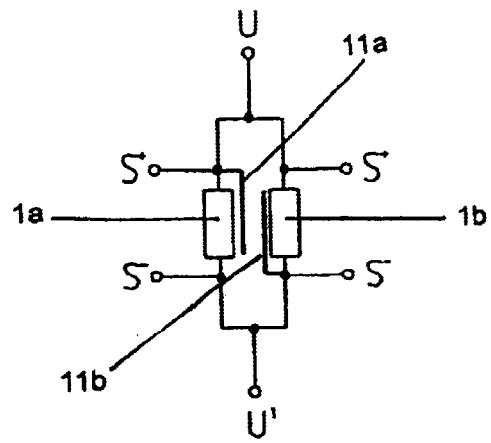
FIG. 6A is a circuit diagram of a preferred embodiment of parallel-interconnected shunt resistors with asymmetrically contact-connected rear sides, according to the invention.
Figure 6B:
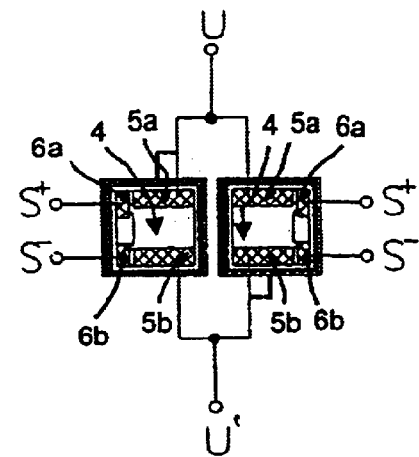
FIG. 6B is a diagramtic plan view of the preferred embodiment of parallel-interconnected shunt resistors with asymmetrically contact-connected rear sides, according to the invention.

The shunt configuration according to the invention is illustrated in FIGS. 6A–6B, in a circuit diagram in FIG. 6A and in the plan view in FIG. 6B. Load current contact areas 5a, 5b are connected to a respective supply potential U and U', or contact-connected thereto by bonding wires. The first supply potential U may be, for example, a positive supply potential, while the second supply potential U' may be, for example, a negative supply potential or the reference ground potential. In order to measure the voltage drop across the shunt resistors 1a, 1b, the sense contact areas 6a, 6b are provided which, are contact-connected to the measurement terminals $S^+$, $S^-$.

The different potentials U, U' are applied to the rear-side contacts 11a, 11b (dotted area) of the embodiment illustrated in FIGS. 6A–6B. This advantageously makes it possible to exploit the fact that the contact area located below the shunt resistors 1a, 1b is available as a conductor track in the second plane, and thus, in part, need not be led laterally to the shunt elements 1a, 1b.

Figure 7:
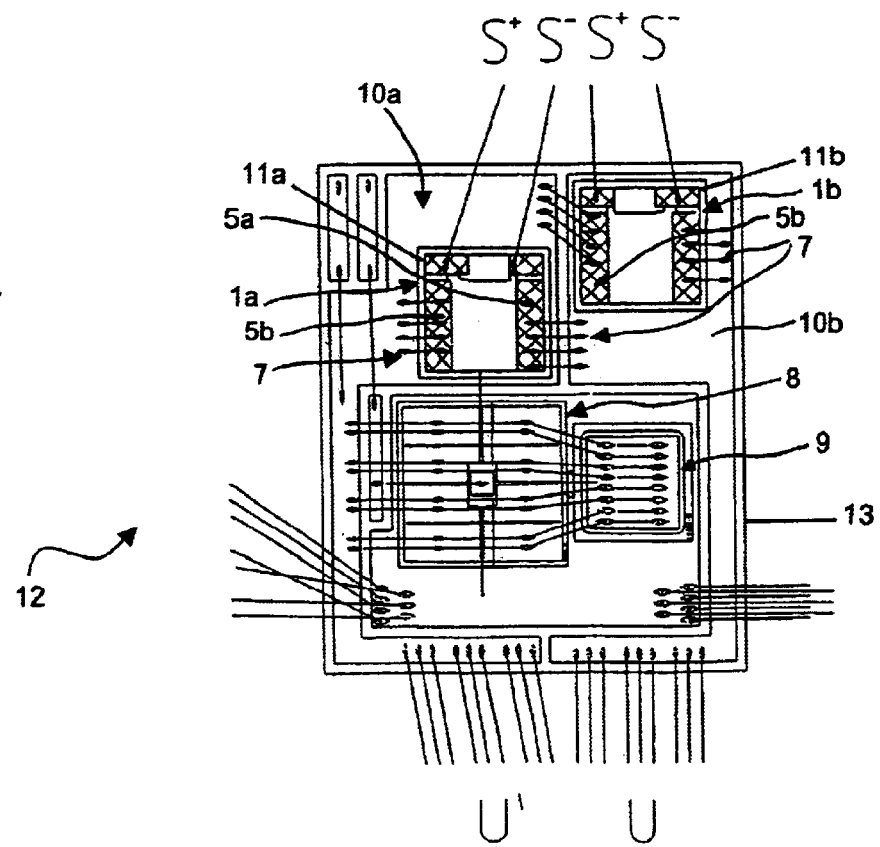
FIG. 7 is a plan view of a component configuration of a particularly preferred embodiment of a semiconductor module having shunt resistors with asymmetrically contact-connected rear sides.

FIG. 7. shows a component configuration with the two semiconductor components 8, 9 (in the present case, a diode 8 and a power switch (IGBT) 9), and the two shunt resistors 1a, 1b connected in parallel. The rear-side contacts of the two shunt resistors 1a, 1b connected in parallel are in each case disposed on different conductor tracks 10a, 10b. In other words, the shunt resistor 1a is disposed on the conductor track 10a and is connected to the potential U', while the shunt resistor 1b is disposed on the conductor track 10b and is connected to the potential U.

The shunt resistor 1a, 1b in each case has the carrier material 2 with good thermal conduction. The thin insulation layer 3 is applied to the carrier material 2, and at least one resistance layer 4 is applied thereto. The resistance track 4 may be a Cu—Ni alloy. The sense contact areas 6a, 6b on the front side of the shunt resistors 1a, 1b are contact-connected to the measurement terminals S$^+$ and S$^-$. The load current contact areas 5a, 5b on the front side of the shunt resistors 1a, 1b are connected to the conductor tracks 10a, 10b, and thus to the supply voltage U, U' by a multiplicity of bonding connections 7.

With regard to the electrical behavior, the symmetry properties are maintained. However, with regard to the configuration, a higher degree of freedom in the configuration layout is advantageously achieved by the configuration according to the invention. It is acheived particularly by the fact that a valuable saving of the area can be realized on the printed circuit board 13 by the parallel circuit of the shunt resistors of the present invention.

We claim:

1. A shunt resistor configuration, comprising:
    shunt resistors including a first shunt resistor and at least one second shunt resistor connected in parallel with said first shunt resistor forming a parallel circuit,
    said shunt resistors having:
        front sides; and
        load terminals disposed at said front sides of said shunt resistors and between supply potentials including a first and a second supply potential, said load terminals each having a large-area rear-side contact connection with different potentials.

2. The configuration according to claim 1, further comprising a first conductor track and a second conductor track, said large-area rear-side contact connection of said first shunt resistor disposed on said first conductor track having the first supply potential, and said large-area rear-side contact connection of said second shunt resistor disposed on said second conductor track having the second supply potential.

3. The configuration according to claim 1, further comprising bonding wires, said load terminals at said front sides of said shunt resistors and said large-area rear-side contact connection electrically interconnected by said bonding wires.

4. The configuration according to claim 1, further comprising a plated-through hole, said load terminals at said front sides of said shunt resistors and said large-area rear-side contact connection electrically interconnected by said plated-through hole.

5. The configuration according to claim 1, further comprising at least one semiconductor component connected in one of a parallel and a series manner with said parallel circuit of said shunt resistors, said at least one semiconductor component electrically connected to at least one of the supply potentials.

6. The configuration according to claim 5, wherein said semiconductor component is selected from the group consisting of a diode, a MOSFET, an insulated gate bipolar transistor (IGBT), a thyristor, a gate turn-off (GTO) thyristor and a gate commutated thyristor (GCT).

7. The configuration according to claim 1, wherein said shunt resistors further include:
    a carrier material having high conduction for said large-area rear-side contact connection;
    a thin insulation layer applied to said carrier material;
    at least one resistance layer applied to said thin insulation layer;
    sense bonding contact areas for tapping a measurement of a voltage drop across said shunt resistors; and
    a plurality of bonding connections for connecting said load terminals to said first and second conductor tracks and to the supply potentials.

* * * * *